(12) United States Patent
Brod

(10) Patent No.: US 8,796,064 B2
(45) Date of Patent: Aug. 5, 2014

(54) METHOD AND DEVICE FOR PRODUCING A SOLAR MODULE COMPRISING FLEXIBLE THIN-FILM SOLAR CELLS, AND SOLAR MODULE COMPRISING FLEXIBLE THIN-FILM SOLAR CELLS

(75) Inventor: Volker Brod, Bad Abbach (DE)

(73) Assignee: Muehlbauer AG, Roding (DE)

( * ) Notice: Subject to any disclaimer, the term of this patent is extended or adjusted under 35 U.S.C. 154(b) by 127 days.

(21) Appl. No.: 13/642,371

(22) PCT Filed: Apr. 19, 2011

(86) PCT No.: PCT/EP2011/001988
§ 371 (c)(1),
(2), (4) Date: Nov. 14, 2012

(87) PCT Pub. No.: WO2011/131346
PCT Pub. Date: Oct. 27, 2011

(65) Prior Publication Data
US 2013/0052773 A1    Feb. 28, 2013

(30) Foreign Application Priority Data

Apr. 21, 2010  (DE) .......................... 10 2010 015 740

(51) Int. Cl.
*H01L 21/00* (2006.01)
(52) U.S. Cl.
USPC .................... 438/73; 29/742; 438/61; 438/80
(58) Field of Classification Search
USPC ............................ 438/61, 62, 73, 80; 29/742
See application file for complete search history.

(56) References Cited

U.S. PATENT DOCUMENTS

| | | |
|---|---|---|
| 5,232,519 A | 8/1993 | Glatfelter |
| 5,273,608 A | 12/1993 | Nath |
| 5,457,057 A | 10/1995 | Nath |
| 5,584,940 A | 12/1996 | Yoshida |
| 6,117,703 A | 9/2000 | Penndorf |
| 6,329,588 B1 | 12/2001 | Zander |
| 6,391,458 B1 | 5/2002 | Zander |
| 6,429,369 B1 | 8/2002 | Tober |
| 2002/0148496 A1 | 10/2002 | Dorner |
| 2003/0127124 A1 | 7/2003 | Jones |
| 2007/0065962 A1 | 3/2007 | Pichler |
| 2007/0131274 A1 | 6/2007 | Stollwerck |

FOREIGN PATENT DOCUMENTS

| | | |
|---|---|---|
| DE | 199 21 514 A1 | 11/2000 |
| DE | 100 20 784 A1 | 11/2001 |
| DE | 202 20 444 U1 | 9/2003 |
| DE | 10 2008 026 294 A1 | 12/2008 |
| DE | 10 2008 018 360 A1 | 10/2009 |
| DE | 10 2008 020 458 A1 | 11/2009 |
| DE | 10 2008 046 327 A1 | 3/2010 |
| EP | 0 111 394 A2 | 6/1984 |
| EP | 0 584 722 A1 | 3/1994 |
| JP | 2-244772 A | 9/1990 |
| JP | 10-65194 A | 3/1998 |
| WO | WO 92/06144 A1 | 4/1992 |
| WO | WO 94/22172 A1 | 9/1994 |
| WO | WO 2010/015858 A2 | 2/2010 |

*Primary Examiner* — Reema Patel
(74) *Attorney, Agent, or Firm* — John A. Miller; Miller IP Group, PLC

(57) ABSTRACT

A method for producing thin-film solar modules, comprising the following steps: providing flexible thin-film solar cells as separate segments in a container or on a web wound up to a roll, the flexible thin-film solar cells bearing with a first side against the web, wherein each of the flexible thin-film solar cells is designed to have a first electric pole and a second electric pole; transferring the flexible thin-film solar cells from the web to a first film web such that the first pole of a first flexible thin-film solar cell is positioned next to the second pole of a second thin-film solar cell; and applying electrically conductive contact strips to the first and second poles of the flexible thin-film solar cells in longitudinal and/or transverse direction relative to the conveying direction of the first film web.

25 Claims, 12 Drawing Sheets

Cross section through solar module

METHOD AND DEVICE FOR PRODUCING A SOLAR MODULE COMPRISING FLEXIBLE THIN-FILM SOLAR CELLS, AND SOLAR MODULE COMPRISING FLEXIBLE THIN-FILM SOLAR CELLS

CROSS-REFERENCE TO RELATED APPLICATIONS

This application is a National Stage application of International Application No. PCT/EP2011/001988, filed Apr. 19, 2011, which claims priority to German Patent Application Serial No. DE 10 2010 015 740.6, filed Apr. 21, 2010.

BACKGROUND

A method and an apparatus for producing a solar module with flexible solar cells, in particular flexible thin-film solar cells, are described here, as well as a solar module produced with such an apparatus and in accordance with such a method.

A solar module or photovoltaic module converts the light of the sun directly into electrical energy. By way of most important components it contains several solar cells. A solar module is characterised by its electrical power ratings (in particular open-circuit voltage and short-circuit current). These depend on the properties of the individual cells and on the interconnection of the solar cells within the module.

Ordinarily a solar module has, in addition to the electrically interconnected solar cells, an embedding material and a rear structure. A top layer serves for protection against mechanical influences and influences of weathering. The embedding material and the top layer have to be transparent, in order to keep absorption losses within the spectral range from 350 nm to 1150 nm, and hence efficiency losses of the silicon solar cells ordinarily employed for electric power generation, as slight as possible. The embedding material (for example, ethyl vinyl acetate (EVA) film) serves for bonding the module composite. EVA has to be melted down at about 150° C. This is where the crosslinking process begins which lasts for about 15 minutes to 30 minutes. By reason of this long process-time, hitherto EVA has had to be processed only discontinuously in a vacuum laminator. The processing parameters (time-dependent pressure and temperature curves) for EVA are very limited. Furthermore, EVA turns yellow under the action of UV light. Molten EVA also flows into the interstices of the solar cells that are electrically contacted or that are connected to conductive adhesives, and in the process is thermally crosslinked. The formation of air bubbles, resulting in diminution of the power ratings (power generated by the solar module), is avoided by a lamination under vacuum and/or mechanical pressure. The rear structure protects the solar cells and the embedding material from moisture and oxygen. In addition, it also serves as mechanical protection in the course of mounting the solar modules, and as electrical insulation. The rear structure may have been formed from glass or from a composite film.

A common variant in this connection is constituted by solar modules with crystalline solar cells which are configured as silicon solar cells with a size of approx. 10 cm×10 cm to 15 cm×15 cm and a thickness of approx. 0.3 mm and which are very fragile. Between 6 and 100 solar cells are combined here to form a solar module. However, this type of solar module consisting of crystalline solar cells is very material-intensive in production and requires extremely careful handling in the course of mounting. An alternative to this is constituted by solar modules with thin-film solar cells which are applied in several layers of different materials onto a carrier material. By way of carrier material, also called the substrate, use is made as a rule of glass, metal foil or plastic film. The glass-pane sizes and sheet web widths are determined by the respective production process. A customary size for glass substrates is 60 cm×100 cm or 60 cm×120 cm. Thin-film solar cells may—depending on the carrier material—be flexible, but they require protection against corrosion.

STATE OF THE ART

At the end of 2008 the Bystronic glass Technologiezentrum (www.bystronic-glass.com) put into operation a roll laminator for press-moulding thin-film modules. Shorter manufacturing-times can be obtained in a roll laminator than in a vacuum laminator. Individual glasses by way of substrate are washed, positioned with high precision, and a polyvinyl butyral (PVB) film is prepared automatically. The PVB film is unwound directly from the roll. After the exact superposition of the film and of a covering pane onto the substrate and also after the final truncating of the projecting film, the module goes into the roll laminator for thermal treatment. In the roll laminator the module passes through a preheating zone, three main heating zones and two rolling presses. Temperatures between 130° C. and 240° C. prevail in the heating zones. The thermal effect on the film is generated by medium-wavelength quartz radiators. A module dwells in the roll laminator for about a minute. Glasses and film then enter into definitive combination at around 140° C. at 13 bar for about 3-4 hours in a hot-air autoclave.

Robert Bürkle GmbH offers for sale an apparatus, called Ypsator®, for laminating photovoltaic modules. These are multi-stage systems which laminate photovoltaic modules on several levels. In order that the photovoltaic modules are watertight, the safety glass, the encapsulating films and the crystalline solar cells are laminated together to form a 'solar sandwich'. In a first step the modules are prelaminated. In this process, moisture and air pockets are removed from the sandwich in a vacuum, and a vacuum-tight composite is produced. The process is then interrupted, and in a second step the vacuum-tight composite is laminated in a following press so as to be ready to use. In the third step the solar module is cooled from 150° C. to hand heat.

WO 03/059570 relates to a machine for the automatic assembly of solar cells in rows. This machine has a computer-based control system, an operator interface, a cell-holding station for holding a number of solar cells provided for the mounting, a pre-mounting cell-inspection station for inspecting and passing/rejecting individual cells for the further mounting. Furthermore, the machine has a strip-material supply station for holding and supplying a continuous length of the strip material for the purpose of producing strips, a strip-cutting and folding station for cutting and folding the strip material into strips, a row-mounting station for mounting of the cells and of the strips in a row. In addition, the machine has a transport mechanism which has a tool head for cell-pick-up and movement, in order to pick up the cells and to move them through the pre-mounting cell-inspection station and to place the cells in their sequence in the row-mounting station. Furthermore, the machine has a strip-transfer tool, in order to transfer pairs of strips in their sequence into the cell-mounting station. A horizontally movable plate with holding devices serves for gripping an individual cell for the purpose of moving the row from the row-mounting station along a process path which terminates at a post-mounting row-handling station. A soldering station has a preheating zone, a soldering zone and a cooling zone. A holding area for accepted rows is integrated into the post-mounting row-handling station, the plate having been constructed on straight rails with stepping-motor control devices, in order to accept into the post-process row-handling station the row in stages of a predetermined cell array along the process path from the row-mounting station through the soldering station to a post-mounting row-holding area. The post-process row-handling station has been constructed with a vertically, horizontally and rotatably movable row-handling tool, in order to grip individual rows and to move them away from the post-mounting holding area to the post-mounting row-inspection station and from there to one of the holding areas for good rows and for rejected rows.

DE 10 2008 018 360 A1 relates to a method for affixing solar cells on a connecting carrier. The solar cells are connected to the connecting carrier, and the connecting carrier has been provided with conductor tracks which exhibit contact points at which soldered joints for contacting corresponding contact points of the solar cell are to be formed. Use is made here of a connecting carrier that has been provided at its contact points with solder in the form of a solder paste, the solar cells are arranged on the connecting carrier, and the solder is locally heated in order to melt it and to form a soldered joint between the connecting carrier and the solar cells.

The solder is applied onto the connecting carrier. The heat for heating the solder is supplied on the side of the solar cells facing away from the connecting carrier, so that the heat is supplied to the solder through the solar cells. Between a source of heat and the arrangement consisting of connecting carrier and solar cells a solder mask is arranged which exhibits openings in the region of the contact points. The heat is generated with a hot-air blower, with a laser or with a source of infrared light.

A component-placement station serves for arranging solar cells on the connecting carrier, and a soldering station serves for local heating of the solder, so that soldered joints form between the connecting carrier and the solar cells. A conveying path serves for conveying a tape-like connecting carrier. Arranged downstream of the soldering station in the conveying direction is a cutting station, in order to separate solar-cell modules from the tape-like connecting carrier. A solar-cell module produced in such a manner has a multi-layer connecting carrier, with conductor tracks having been formed in different planes on the connecting carrier. The connecting carrier is a rigid plate which also acts as mechanical substrate of the solar-cell module.

DE 10 2008 026 294 A1 relates to a loading/unloading apparatus for a pane-carrier with a lifting device that can be moved through a receiving opening in the pane-carrier and with a pane-transport device arranged on the head of the lifting device, in order to position panes relative to the receiving opening.

DE 10 2008 046 327 A1 relates to an arrangement of several production apparatuses by way of plant for processing solar cells so as to form a module. This plant exhibits production apparatuses for the following steps: providing the carriers, prefabrication of the solar cells by affixing of contact wires, arranging transverse contact wires on the carrier, placing the prefabricated solar cells onto the carrier, longitudinal interconnection of the prefabricated solar cells on the contact wires, transverse interconnection of the prefabricated solar cells on the transverse contact wire, and bringing the solar cells located on the carrier together onto a carrier glass for the purpose of manufacturing the module.

WO 94/22172 relates to the use of a roll laminator instead of vacuum-plate laminators employed hitherto.

The plastic films that are used are only suitable to a limited extent for the encapsulation of solar modules. The films are neither sufficiently impact-resistant nor stable as regards weathering, nor is the adhesive layer soft enough in order to give the easily fragile solar cells effective mechanical protection.

WO 99/52153 and WO 99/52154 relate to the use of composite films and composite bodies consisting of a polycarbonate layer and a fluoropolymer layer for the encapsulation of solar modules. For the purpose of adhesion bonding, use is made of EVA hot-melt adhesive, which can only be processed slowly.

JP 10065194 A relates to a method for producing a solar-cell module, wherein a sealing film and a carrier film are transferred with low friction and stably. For this purpose, solar cells stuck onto a flexible base film are inserted between two insulating sealing films of heat-conducting adhesive together with the wiring which forms the electrical connection of a solar cell. The sealing films and supporting films are glued together as base films and are sealed by rollers.

According to Bayer MaterialScience AG (www.presse-.bayerbms.de), the production of solar modules is simplified with the aid of light-resistant thermoplastic polyurethanes (TPU). A film of Desmopan® also permits continuous production instead of the customary batch manufacture. Solar cells produced hitherto from silicon wafers have been positioned with an embedding film (for example, EVA films) between a pane of glass and a carrier and have been thermally crosslinked in a vacuum laminator over a period of 12 minutes to 20 minutes at temperatures around 145° C. By reason of the higher melting-point, films of Desmopan® must not be crosslinked. The reduction of the cycle-time in the vacuum laminator allows continuous manufacturing of the solar modules. EP 1 302 988 A2 relates to photovoltaic modules with a thermoplastic adhesive layer, and to their production.

From JP-A-2-244 772 a method is known wherein a tape-like solar cell is wound onto a cylindrical body, onto which an adhesive has been applied, in such a manner that adjacent solar cells overlap. This overlap is such that the back electrode of the one solar cell contacts the top electrode of the adjacent other solar cell. The individual solar cells are pressed into the adhesive obliquely in relation to the horizontal. In addition, an insulating film is located between the adhesive and the cylindrical body. For the purpose of producing a module, the body that has been wound onto the cylinder and also the insulating film are cut through and are removed from the cylinder, so that a rectangular, thin film module with series-interconnected solar cells is obtained.

A method for embedding photovoltaic cells is known from U.S. Pat. No. 5,273,608.

In U.S. Pat. No. 5,232,519 a photovoltaic module is described wherein on the upper sides of the top electrodes of each strand-like group of solar cells a discharge strip, also called a discharge grid, for tapping the generated voltage is located. In order to avoid a situation where the discharge strips shade off the top electrode and hence also the absorber layer located beneath it, in this document the provision of a V-shaped depression in the covering layer module overlaying the entire module above each discharge tape is proposed. As a result, the incident solar rays are to be deflected in such a way that, as far as possible, these rays do not impinge on the respective discharge tape.

A method for producing tape-type solar cells on the basis of copper strips coated on one side with CIS (copper indium diselenide) and its homologues, and a suitable apparatus for this method, are known from DE-C2-196 34 580, for example.

Thin-film solar cells on the basis of the Ib/IIIa/VIa compound semiconductors and also methods for producing thin-film solar cells of such a type are described in German patent applications DE-A 199 21 514 and DE-A 199 21 515.

A photovoltaic module is known from U.S. Pat. No. 5,457,057.

In this module a number of individual plates have been electrically connected to one another in such a manner that a voltage desired for the particular application and the requisite current are made available. The plates are interconnected in series, in order to increase the generated voltage. Furthermore, in this document it is mentioned generally that in some cases groups of series-interconnected plates can be connected to one another in parallel, in order to fulfil the demanded performance requirements at predetermined voltage. Also in this case, so-called discharge wires are located in or on the topmost layer of each plate.

From DE-A 100 20 784 a photovoltaic module is known wherein, for the purpose of parallel interconnecting of several groups of series-interconnected solar cells, on the one hand the electrically conducting back electrodes of a first solar cell of each group and, on the other hand, the electrically conducting back electrodes of the last solar cell of each group have been electrically connected to one another.

In this regard, each group forms a strand of several tape-like solar cells arranged serially with respect to one another. Solar cells adjacent to one another have been arranged here in mutually overlapping manner in such a way that the back electrode of the one solar cell contacts the top electrode of the adjacent other solar cell, the solar cells being of flat construction and each arranged inclined in relation to the horizontal. The back electrodes of the respectively first solar cell of each group and the back electrodes of the respectively last solar cell of each group have been respectively connected to one another by means of a discharge tape, each discharge tape being arranged perpendicular to the solar cells of each group which have been interconnected in series in overlapping manner. Each discharge tape runs across the back electrode of each group, the one discharge tape being arranged close to the one end of the back electrodes, and the other discharge tape being arranged close to the opposite other end of the back electrodes, and in each instance an electrical insulating layer is located between the one discharge tape and the back electrodes of each group, except for the back electrode of the respectively first solar cell, and also between the other discharge tape and the back electrodes of each group, except for the back electrode of the respectively last solar cell. Between the discharge tapes and the back electrodes of the solar cells, except in the area of contact of the discharge tapes with the respectively first and last cells, a hot-melting layer has been provided. The several groups have been embedded all around in a plastic that is capable of being activated by heat.

DE-A 101 01 770 presents a solar module wherein the front side consists of transparent polyurethane.

DE 202 20 444 U1 presents a thermoplastic aliphatic polyurethane which is used as the embedding material for solar cells in the layer of a photovoltaic module.

DE-A 10 2008 046 327 presents an arrangement of several production apparatuses by way of production line for processing or producing solar cells so as to form a module. A production apparatus has been provided for prefabricating the solar cells by affixing of contact wires or laminae on the front and rear sides of the solar cells. A production apparatus has been provided for applying the prefabricated solar cells onto a carrier. A production apparatus has been provided, in order to make the carrier or carriers available. A production apparatus has been provided, in order to affix transverse contact wires onto the carrier. A production apparatus has been provided, in order to undertake the transverse interconnection of the prefabricated solar cells at the transverse contacts. A production apparatus has been provided, in order to carry out the longitudinal interconnection of the solar cells. This is carried out by connecting the contact wires to an adjacent solar cell in each instance. A production apparatus serves to apply the solar cells located on the carrier onto a carrier glass. The production apparatuses are arranged along a line.

DE-A 10 2008 020 458 presents a method and also an apparatus for producing a solar-cell strand, wherein at least two solar cells are provided with cell connectors. The cell connectors each run along an upper side of a first solar cell and along an underside of an adjacent solar cell and each connect two adjacent solar cells electrically. The cell connectors are continuously applied onto the solar cells. The cells are subsequently soldered together, also continuously. In this regard, the speeds of the two sequences constituted by 'applying the cell connectors' and 'soldering the cells' are matched to one another in such a way that, overall, a continuous production of the solar-cell strands is effected.

From US-A 2007/0065962 a method is known for producing solar modules consisting of several solar cells. One side of the solar cells is configured on a first edge as first pole, and on a second edge as second pole. These cells are relocated onto a first film web in such a way that a first solar cell is positioned with its first edge forming the first pole in the immediate vicinity of a second edge, forming the second pole, of a solar cell. Electrically conducting contact strips are affixed onto the first and second poles of the solar cells in the longitudinal and transverse directions, in order to interconnect the solar cells electrically in series and/or in parallel.

A multi-layer strip of large-area solar cells and methods for generating this multi-layer strip are known from EP-A 0 111 394.

Problems of the aforementioned techniques and of other techniques are, inter alia, that they require or constitute elaborate machines, the solar modules to be produced with them do not always have the demanded stability and operational reliability, and their electrical connections are also not reliable enough. Accordingly, some of the mounting techniques bring about an excessive thermal stress in the course of soldering the solar cells. By reason of temperature differences arising between the hot soldered joint and the cooler environment the solar cells may have a tendency to crack. In other modules it may happen that the metal paste forming the conductor tracks or emitters does not offer a solid cohesion. Wind loads and snow loads acting on a solar module in the daily or seasonal cycle may then break the emitters. This separates many of the solar cells from the electrical composite of the solar module and reduces the electrical power output thereof. In the case of thin-film modules the internal electrical cell interconnection may easily become defective; for example, the modules may have been connected to copper strips which have been affixed with an insufficiently cured conductive adhesive. Hence the line resistance of the solar modules rises considerably, and their efficiency falls.

Underlying Object

Now the object consists in making available an inexpensive, rapid method for lamination and an effective method for producing flexible solar cells, in order to enable a cost-effective generation of solar power, wherein the production costs are lower in comparison with previous solutions and the durability of the solar modules is improved in comparison with previous solutions.

Proposed Solution

This object is achieved by an arrangement with the features of the independent apparatus claim and also by a method with the features of the independent method claim. Advantageous and also preferred configurations are the subject-matter of the dependent claims and will be elucidated in more detail in the following. The wording of the claims is made the content of the description by explicit reference. Many of the following features are mentioned only for the arrangement or for the method. Independently thereof, however, they are to be capable of applying both to the arrangement and to the method.

A method presented here for producing thin-film solar modules may have the following steps: method for producing thin-film solar modules, with the following steps: making available flexible thin-film solar cells in the form of separate segments in a container or on a web wound up into a roll, the flexible thin-film solar cells resting on the web with a first side, each of the flexible thin-film solar cells being configured with a first electrical pole and with a second electrical pole, relocating the flexible thin-film solar cells from the web onto a first film web in such a way that a first flexible thin-film solar cell is positioned with its first pole close to the second pole of a second flexible thin-film solar cell, and applying electrically conducting contact strips onto the first and second poles of the flexible thin-film solar cells in the longitudinal and/or transverse directions relative to the conveying direction of the first film web, in order to interconnect the flexible thin-film solar cells electrically in series and/or in parallel, laminating a transparent, flexible, second thermoplastic film web onto the first film web and onto the flexible thin-film solar cells, in order to form a solar-module strand formed from the first and the second film webs and from the flexible thin-film solar cells located in between, isolating the plurality of thin-film solar modules from the solar-module strand, and introducing these isolated thin-film solar modules into a crosslinking station.

The second film web (and, where appropriate, also the film web onto which the second film web has to be applied) can be brought to a temperature within a range from about 60° C. to about 110° C. and, where appropriate, can be laminated onto the first film web and onto the flexible thin-film solar cells with a pressure by means of a roll laminator. This temperature range lies significantly below the crosslinking-temperature of the first and/or the second film web. In this temperature range from about 60° C. to about 110° C. the film webs are only attached to one another so as to be incapable of sliding in relation to one another, that is to say, they are fixed to one another without crosslinking.

A roll laminator with at least one roll pair consisting of counter-rotating, possibly heatable rollers serves for this purpose. The stack consisting of first film web with the flexible thin-film solar cells and the second film web is conveyed through between the rollers. The counter-rotating rollers rotate at a defined speed and with a defined pressure and press together a composite consisting of the second film web, the first film web and the flexible thin-film solar cells at a defined temperature. In this case a preheating zone, for example with infrared radiators or such like, may also have been assigned to the/each roll laminator on the upstream side, with which the film webs to be laminated are brought to the desired temperature level. Provided that the rolls of the roll laminator following the preheating zone are also heated, the preheating zone may bring about only a first heating step.

By way of the first and/or the second film web, use may be made of a thermoplastic polyurethane film. However, other film webs that likewise have a higher melting-point than EVA and/or do not have to be crosslinked are also capable of being employed. EVA (ethyl vinyl acetate) films also serve for bonding the entire module composite together. For example, EVA fuses upon being heated to about 150° C. and also flows into the interstices of the electrically connected solar cells and is thermally crosslinked.

The flexible thin-film solar cells have preferentially been embedded into the film webs consisting of, for example, EVA, which only melts at temperatures around approx. 150° C. (=curing-temperature of EVA), becomes crystal-clear and then crosslinks three-dimensionally. Only after cooling from the crosslinking-temperature, for example to room temperature, is a lasting composite present, in which the cells have been protected against environmental influences. A formation of air bubbles between the film webs, which result in reflection of sunlight and hence in electrical power losses, is avoided by virtue of a lamination with the rolls with defined contact pressure and also, where appropriate, under reduced pressure.

In the course of relocating the flexible thin-film solar cells onto the first film web, a plurality of flexible thin-film solar cells may be arranged in the longitudinal and/or transverse directions relative to the conveying direction of the first film web. In this way, the desired configuration of serial and/or parallel interconnection of the individual flexible thin-film solar cells to form a cell array forming the solar module can be established in very flexible manner.

The electrically conducting contact strips may be applied onto the flexible thin-film solar cells in the longitudinal direction relative to the conveying direction of the first film web from one or more mutually adjacent dispensers arranged substantially in the longitudinal direction relative to the conveying direction of the first film web, with rolls of conducting contact strips or dispensers with conducting paste. Alternatively or additionally, the electrically conducting contact strips may be applied onto the flexible thin-film solar cells in the transverse direction relative to the conveying direction of the first film web from at least one dispenser arranged substantially in the transverse direction relative to the conveying direction of the first film web, with a roll of conducting contact strips or with a dispenser with electrically conducting paste. Hence it is possible to interconnect the flexible thin-film solar cells electrically in series and/or in parallel very variably and efficiently.

The second film web can be laminated onto the first film web and onto the flexible thin-film solar cells with a roll laminator. The roll laminator has at least two counter-rotating rollers which rotate at a defined speed and press together with a defined pressure a composite consisting of the second film web, the first film web and the flexible thin-film solar cells at a defined temperature (preferentially below the crosslinking-temperature). This permits solar panels of arbitrary size to be produced without air bubbles appearing in the finished module, thereby negatively affecting the quality or electrical performance of the modules. The rate of feed at which the films are processed by the roll laminator so as to form the composite amounts, for example, to about 0.5 m/min to about 5 m/min.

The flexible thin-film solar cells may also bear no adhesive layer on their photoelectrically inactive side (underside). In order nevertheless to ensure a secure positioning of the flexible thin-film solar cells on the first film web, in a variant a preferentially insulating adhesive layer or adhesive film is applied with one or more additional adhesive dispenser devices, which may have been integrated into the overall arrangement in modular manner, onto the first film web at least at the places where subsequently the flexible thin-film solar cells are set down, before the flexible thin-film solar cells are applied onto the first film web. By way of second film web, a barrier film with adhesive layer may be applied. Suitable by way of edge-insulating material are electrical insulating tapes, pastes, such as polyimide (PI), with corresponding long-term stability and temperature resistance.

The solar-module strand is introduced into the crosslinking station in pieces. For this purpose, prior to introduction the solar-module strand is divided up into segments which each correspond to one or more solar modules or parts thereof.

Advantages, Further Configurations and Properties

An essential aspect of the method that has been presented is that the modular roll-to-stack production solutions or stack-to-stack production solutions yield significant cost savings and also improvements in production and flexibility for the finished flexible thin-film solar modules.

Material-dependent rapid lamination processes are linked herewith an effective connection, to be flexibly adapted to the specifications, of the solar cells. Only at the end of the process chain does the crosslinking of the film webs take place, with temperature profile increased to crosslinking-temperature in the crosslinking station. This permits a customer-oriented, rapidly adaptable ready-made fabrication with regard to length and width both of the individual solar cells and with regard to length and width of the finished solar modules. A further essential aspect is that an apparatus executing the method permits a very much more compact form factor in comparison with known arrangements. Consequently it is possible to set up more production plants per unit area. The more compact form factor of the apparatus is also associated with considerably shortened throughput-times of the solar cells, and also with low mechanical and thermal stress of the individual solar cells and of the finished solar modules.

The second web film may have a high transparency within the light-wavelength range from about 350 nm to about 1150 nm, as well as a good adhesion on the flexible thin-film solar cell, on the rear contact of the solar cell, on the front contacts and on any anti-reflection layer of the solar cell. The second web film may have been formed from one or more films.

The second web film also serves to equalise the tensions that arise by virtue of the differing thermal coefficients of expansion of plastic and silicon or of the other photoelectrically active coating such as, for example, CIS, CIGS etc. The second web film should have a melting-point below the melting-temperature of the electromechanical connections or of the contact adhesives of the solar cells, typically below about 150° C. The adhesive film should, in addition, exhibit a high electrical resistance, slight absorption of water, high resistance to UV radiation and thermal oxidation, and should be easy to process. CIGS stands for Cu(In,Ga)(S,Se)2 and is an abbreviation for the elements copper, indium, gallium, sulfur and selenium which are used. The most important examples are Cu(In,Ga)Se2 (copper indium gallium diselenide) or CuInS2 (copper indium disulfide).

Only during the process steps in which the film composite is brought together in layers and is fixed together with the roll laminators do temperature (distinctly below the crosslinking-temperature but also considerably above room temperature) and pressure act on the film composite. In the crosslinking station, thermal energy (temperature) in the region of the crosslinking-temperature of the film web(s) acts on the film composite, but no longer any pressure differing from the ambient pressure.

BRIEF DESCRIPTION OF THE DRAWINGS

Further objectives, features, advantages and application options will become evident from the following description of embodiments, to be understood as non-limiting, with reference to the associated drawings. In this connection all the features disclosed in the text or in the drawings, by themselves or in arbitrary combination, constitute the disclosed subject-matter, also irrespective of their grouping in the claims or the subordinating relationships thereof. For a person skilled in the art the overall disclosure contained in the Figures and in the description thereof, inclusive of its details and variants, shows possible embodiments of the method and of the apparatus for producing a solar module with flexible thin-film solar cells, and of a solar module with flexible thin-film solar cells.

DETAILED DESCRIPTION OF EMBODIMENT VARIANTS

Figure 1:
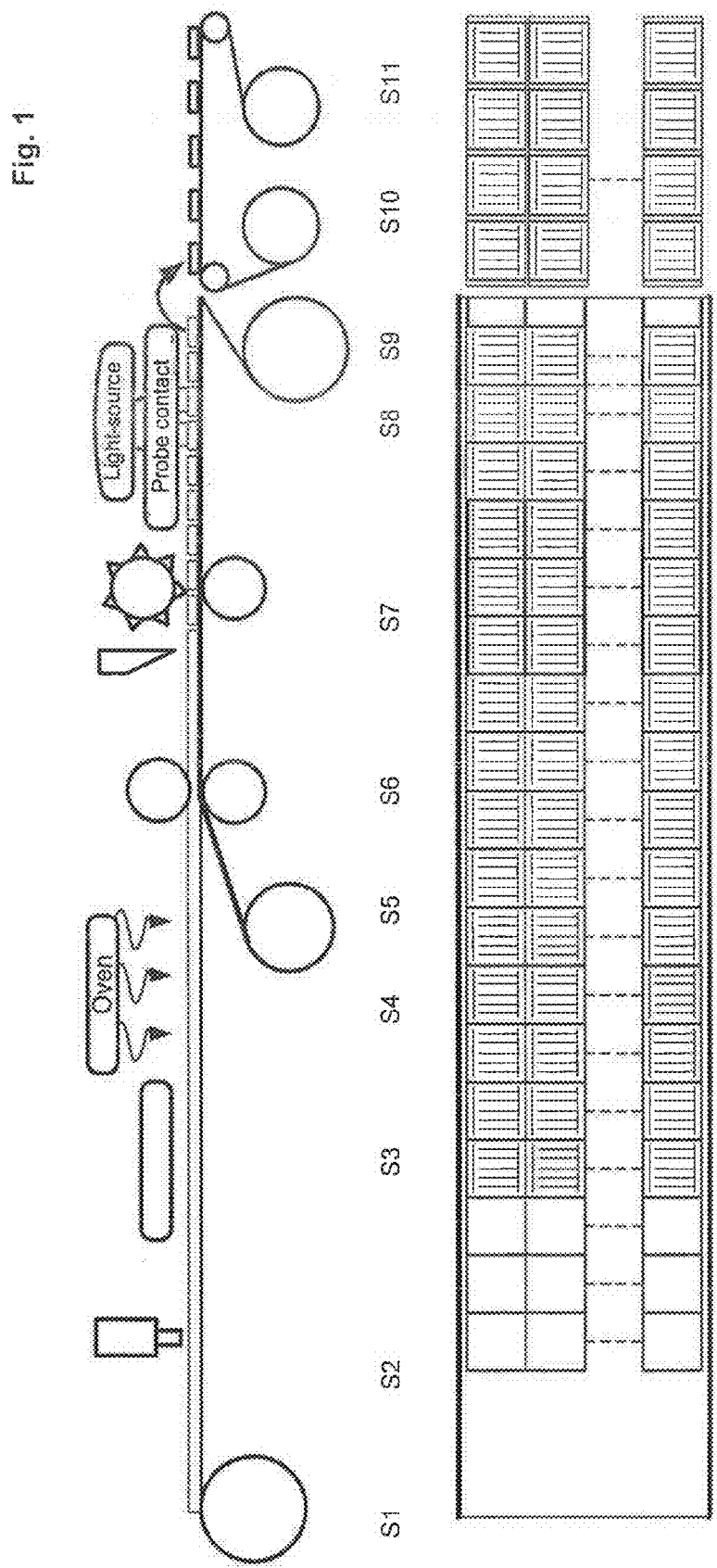
FIG. 1 shows, in a schematic representation, an apparatus and the associated method for making available isolated flexible thin-film solar cells on one or more webs that have been wound up to form a roll.

A method for producing flexible thin-film solar cells on a web that has been wound up to form a roll is shown in FIG. 1 in a schematic representation, wherein the flexible thin-film solar cells adhere to the web with a first side. In detail, the steps are denoted by S1 . . . S11 and are elucidated below.

At S1 a feeding of the absorber material from a roll onto a processing/machining table is effected. At S2 a release is effected of individual cells from the absorber material through cracks of edges and contact structures on the individual cells. At S3 a pressing of electrical cell contacts with light-curable or thermally curable conductive paste is effected. At S4 the curing of the cell contacts is effected by UV light and/or by means of an oven. At S5 a transfer adhesive tape is supplied to the underside of the absorber material, which at S6 is laminated onto the underside of the absorber material. At S7 an isolation of the cells is effected by stamping or cutting. At S8 a light test of each individual cell is effected, wherein the connection data (open-circuit voltage, short-circuit current, etc.) of each individual cell are established with electrical probe contacts and are saved in a testing/documentation computer which is not illustrated in any detail. At S9 the film is again wound up onto a roll, in which connection a sorting/relocating of the isolated, adherent cells onto output webs takes place previously. This relocating of the solar cells permits at the same time their grouping (binning), depending on their established connection data, onto individual output webs of the roll webs B1, B2, . . . Bn. These output webs of the roll webs B1, B2, . . . Bn are supplied at S10 and are wound up again at S11. The further processing is elucidated below, for example in connection with FIG. 8 ff.

Figure 2A:
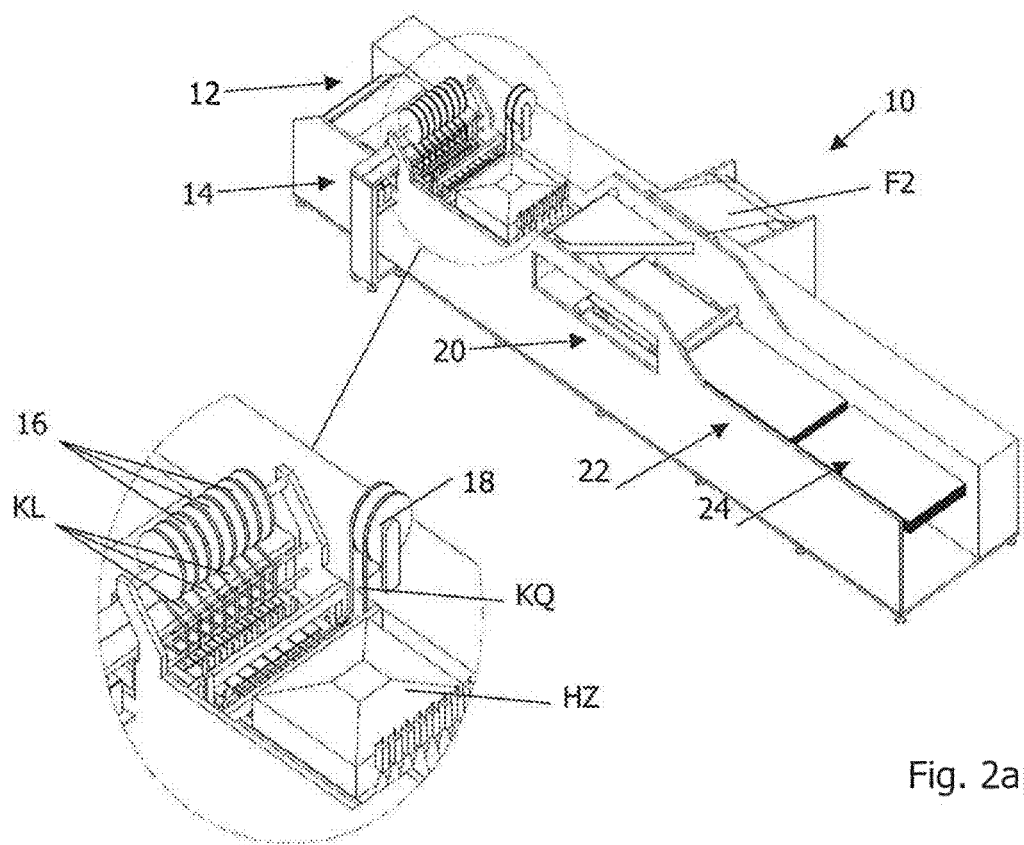
FIG. 2a shows a perspective schematic view of an apparatus for fabricating the solar cells from the output tapes into solar modules.
Figure 2B:
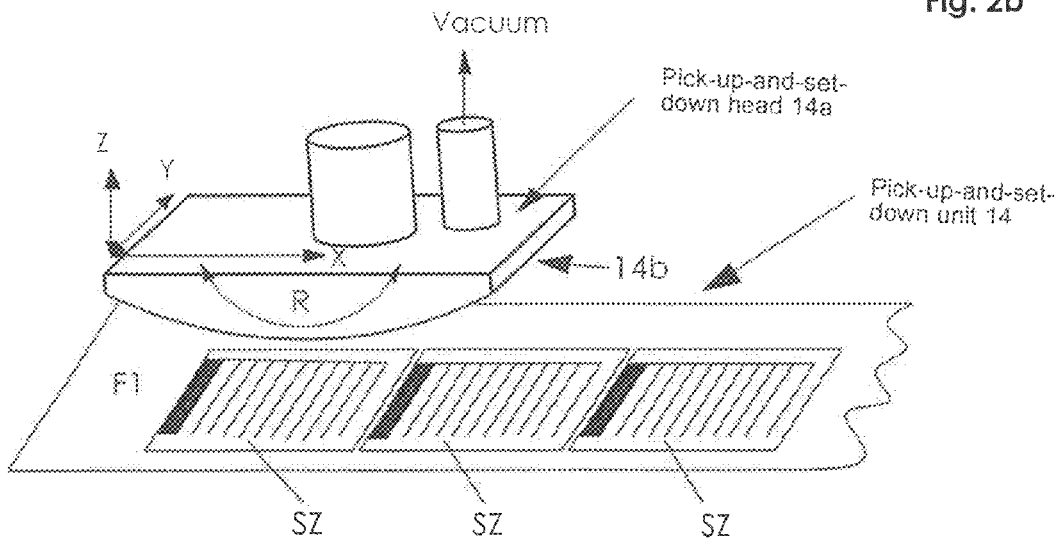
FIG. 2b shows a perspective schematic view of a pick-up-and-set-down unit located in the entry region of the apparatus, in order to pick up and relocate individual flexible thin-film solar cells.
Figure 3A:
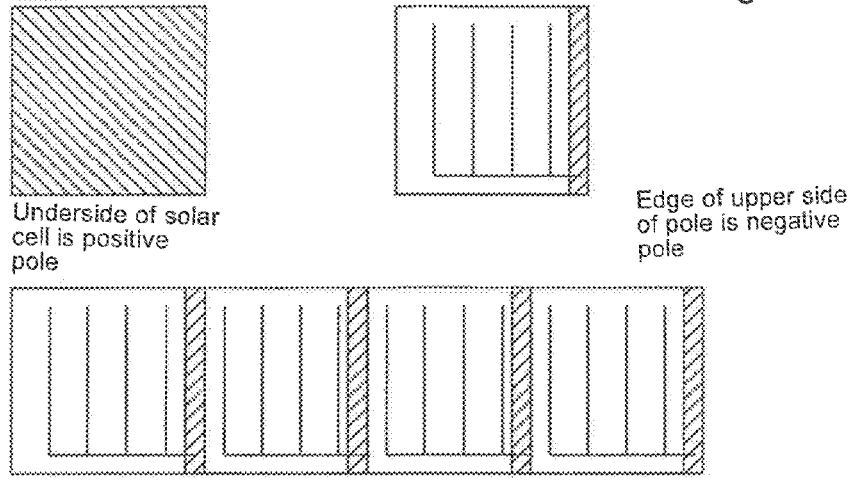
FIG. 3a illustrates schematically how individual flexible thin-film solar cells are relocated onto a first film web FI in such a way that a second thin-film solar cell with an edge region of its first side comes into electrical contact with an edge, configured as second pole, of a second side of a first flexible thin-film solar cell.
Figure 3A:
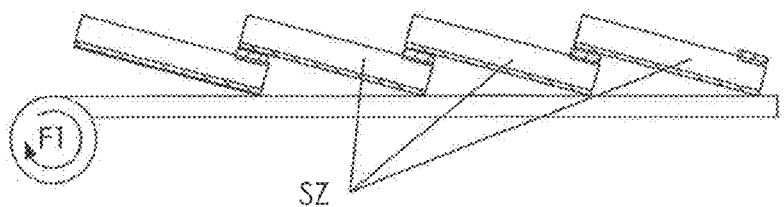
Figure 3B:
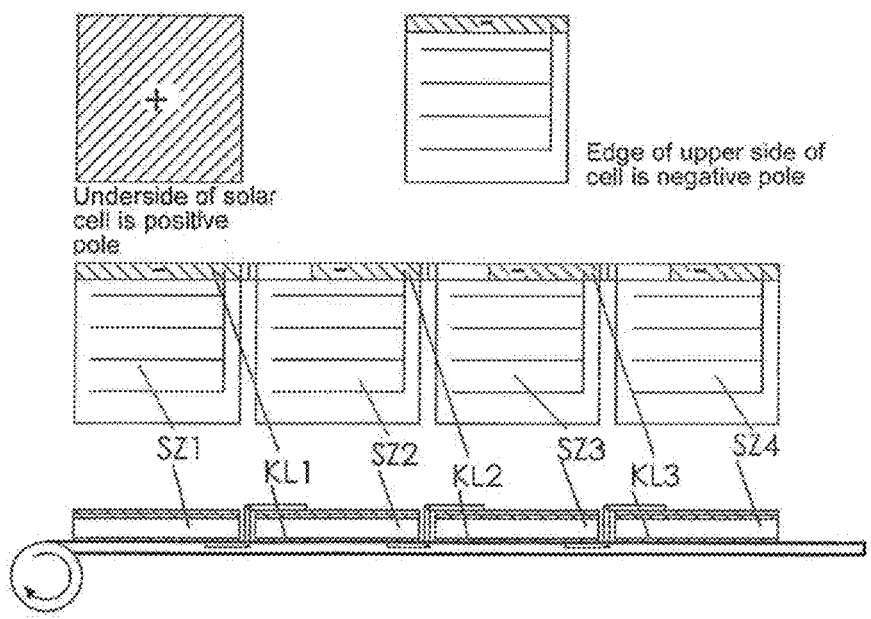
FIG. 3b illustrates schematically how individual flexible thin-film solar cells are relocated onto a first film web FI in such a way that second flexible thin-film solar cells are contacted by a contact strip.

FIG. 2a shows an apparatus 10 for fabricating the flexible thin-film solar cells from the output tapes into solar modules which have been embedded into a solar-module strand. The first side (here, the side facing away from the energy-dispensing light-source in operation, that is to say, the underside) of each flexible thin-film solar cell SZ has a metal layer, at least intermittently. This metal layer is configured as a positive pole. The second side, pointing away from the first film, of the flexible thin-film solar cell (here, the side facing towards the energy-dispensing light-source in operation, that is to say, the upper side) has an edge that is configured as a negative pole. In an entry region 12 of the apparatus 10 individual flexible thin-film solar cells SZ are picked up and relocated in a pick-up-and-set-down unit 14, see FIG. 2b. This is done with a roll-off pick-up-and-set-down head 14a that is capable of being displaced in the X-, Y- and Z-directions. The head 14a has, on its curved surface 14b facing towards the flexible thin-film solar cells SZ, a plurality of small openings which are in flow communication with a source of reduced pressure (vacuum). If this pick-up-and-set-down head 14a with a transverse edge (on the left in FIG. 2b) is lowered onto a flexible thin-film solar cell SZ and is then rolled along over the flexible thin-film solar cell SZ, the latter can be picked up from the output web and retained in planar and gentle manner with reduced pressure. Subsequently the head 14a is raised, displaced, and the individual flexible thin-film solar cell SZ is relocated (positioned, lowered and the reduced pressure switched off) onto a first film web FI coming from a roll in such a way that a second thin-film solar cell with at least one edge region of its first side comes into electrical contact with an edge, configured as second pole, of a second side of a first flexible thin-film solar cell. This procedure is illustrated in greater detail also in FIG. 3a. The head 14a may also have been configured in such a way that after picking up a flexible thin-film solar cell it is able to rotate about its own vertical axis (Z-axis). Accordingly, when being set down, the flexible thin-film solar cells can also be oriented differently with respect to one another, for example in order to connect them to one another in series arrangement. In another variant of the apparatus 10, in the entry region 12 of the apparatus 10 with a pick-up-and-set-down unit 14 individual flexible thin-film solar cells SZ are relocated from the output webs onto a first film web FI coming from a roll in such a way that they have been positioned closely alongside one another with matching orientation. As represented in FIG. 3b, in this regard firstly a first flexible thin-film solar cell SZ1 is set down. Subsequently, from a dispenser 16 (elucidated in greater detail below) an electrically conducting contact strip KL1 is applied onto the negative pole of the first flexible thin-film solar cell SZ1, so that the contact strip KL1 protrudes beyond the electrical contact (negative pole) of the first flexible thin-film solar cell SZ1 and extends onto the first film web FI. The electrically conducting contact strip KL1 extends there so far that a second flexible thin-film solar cell SZ2, after being set down by the pick-up-and-set-down unit 14, comes into electrical contact with its underside configured as second pole (positive pole). This procedure is illustrated in greater detail also in FIG. 3b for further thin-film solar cells SZ3, SZ4 and electrically conducting contact strips KL2 and KL3.

In a further variant of the apparatus 10 the processing process takes as its starting-point flexible thin-film solar cells in which both the positive pole (+) and the negative pole (−) have been arranged respectively on an opposite edge of the upper side of the flexible thin-film solar cells. In this case the relocating of the flexible thin-film solar cells from one of the output tapes onto the first film web FI is effected in such a way that a first flexible thin-film solar cell is positioned with at least its first edge, forming the first pole, in the immediate vicinity of a second edge, forming the second pole, of a second flexible thin-film solar cell. This procedure is illustrated in greater detail also in FIG. 4.

In a contacting region 14 of the apparatus 10 electrically conducting contact strips KL are applied from one or more mutually adjacent dispensers 16, arranged substantially in the longitudinal direction relative to the conveying direction of the first film web FI, with rolls of conducting contact strips the flexible thin-film solar cells in the longitudinal direction relative to the conveying direction of the first film web. In addition, electrically conducting contact strips are applied from a dispenser 18, arranged substantially in the transverse direction relative to the conveying direction of the first film web FI, with a roll of conducting contact strips KQ onto the flexible thin-film solar cells in the transverse direction relative to the conveying direction of the first film web. Hence the flexible thin-film solar cells are interconnected electrically in series and/or in parallel. Instead of the dispensers 16, 18 for the rolls of conducting contact strips KL, KQ, dispensers or dispensing devices may also have been provided with electrically conducting paste, with which the flexible thin-film solar cells are interconnected electrically in series and/or in parallel. In a subsequent heating station HZ the wiring webs, running longitudinally and/or transversely, formed from the contact strips are baked together, so that a thermally and mechanically loadable wiring of the flexible thin-film solar cells arises.

Figure 4:
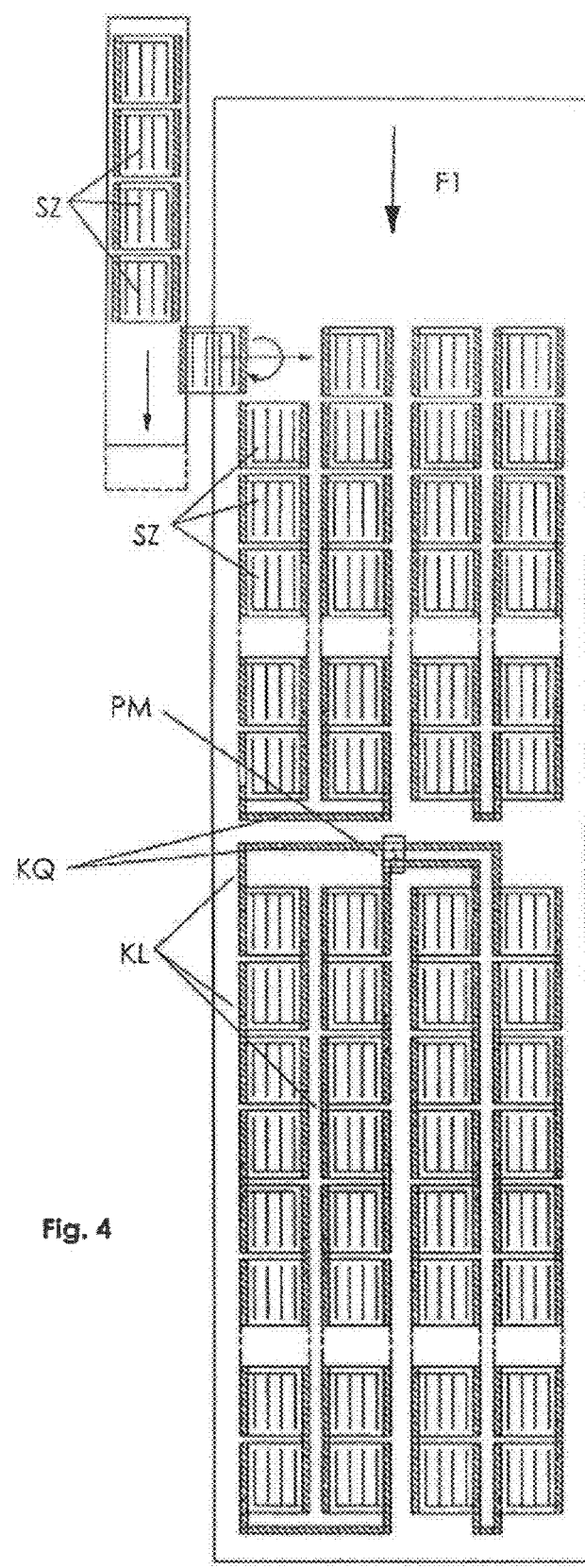
FIG. 4 illustrates schematically a variant wherein flexible thin-film solar cells in which both the positive pole and the negative pole have been arranged respectively on an opposite edge of the upper side of the flexible thin-film solar cells.

The result of the electrical interconnection, in series and/or in parallel, of the flexible thin-film solar cells is likewise illustrated in FIG. 4.

In a laminating station 20 a laminating of a second film web F2 onto the first film web F1 and onto the flexible thin-film solar cells SZ is effected. This second film web F2 is thermoplastic, transparent, flexible and highly resistant to ultraviolet light.

Figure 5:
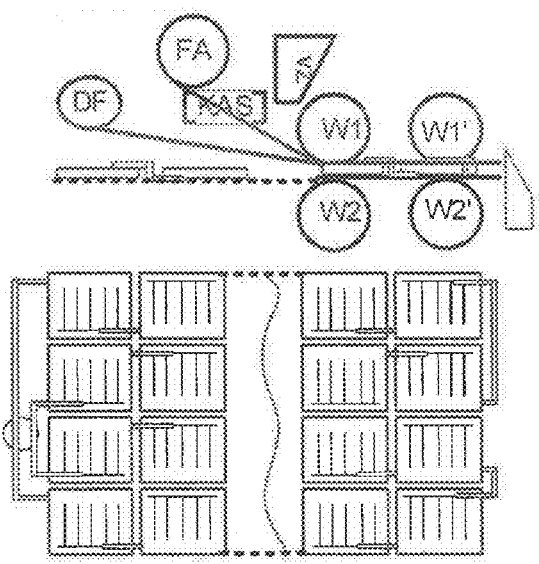
FIG. 5 illustrates schematically how the second film web is laminated onto the first film web and onto the flexible thin-film solar cells with a roll laminator.

The second film web F2 is laminated onto the first film web F1 and onto the flexible thin-film solar cells SZ with a roll laminator RL. The roll laminator RL has at least one roll pair consisting of two counter-rotating rollers W1, W2, between which the stack consisting of first film web F1 with the flexible thin-film solar cells and the second film web F2 is conveyed. The counter-rotating rollers W1, W2 rotate at a defined speed and press together with a defined pressure a composite consisting of the second film web, the first film web and the flexible thin-film solar cells at a defined temperature. Accordingly, the individual components of the composite enter into an integral, intimate connection with one another which is as bubble-free as possible and with which the two mutually adherent film webs are no longer capable of sliding or slipping relative to one another. This is illustrated in exemplary manner in FIG. 5. The roll laminator RL illustrated in FIG. 5 has one or more roll pairs W1, W2; W1', W2', formed from rollers, in order to laminate a self-adhesive top film DF onto the film web FI. As an alternative, a film FA without adhesive layer can be conveyed through an adhesive-application station KAS, in order then to laminate it onto the film web FI. The roll laminator RL illustrated in FIG. 5 is suitable to execute all the process steps described here, in which a film web or material web has to be applied onto another film or onto a film composite already formed from several layers. In a variant, there is assigned to the/each roll laminator a heating zone with which the film webs to be laminated are brought to the desired temperature level, for example below the crosslinking-temperature, prior to being laminated. Provided that the rolls of the following roll laminator have also been heated, the heating zone may bring about only a first heating step in the direction of the softening-temperature or the crosslinking-temperature.

Figure 6:
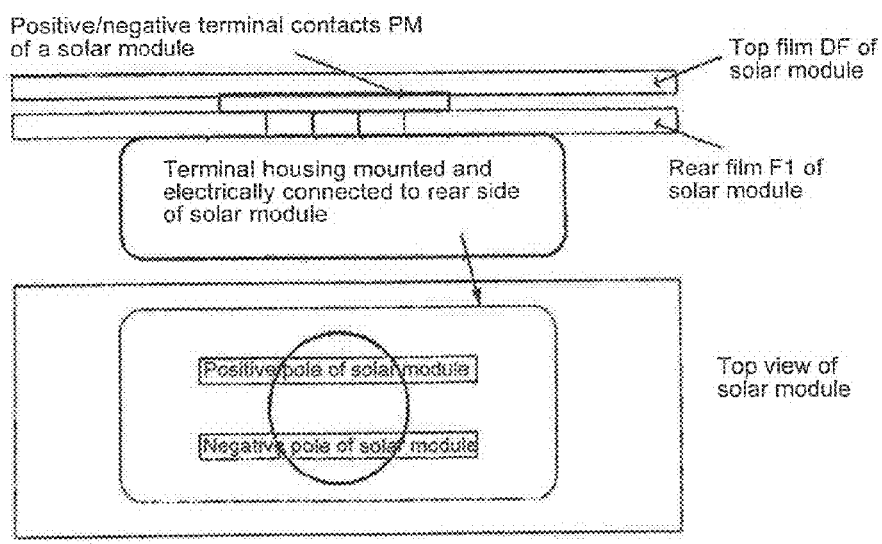
FIG. 6 illustrates schematically a solution variant for preparing the connection of the positive and negative terminals of the interconnected solar module to a connection box.
Figure 7:
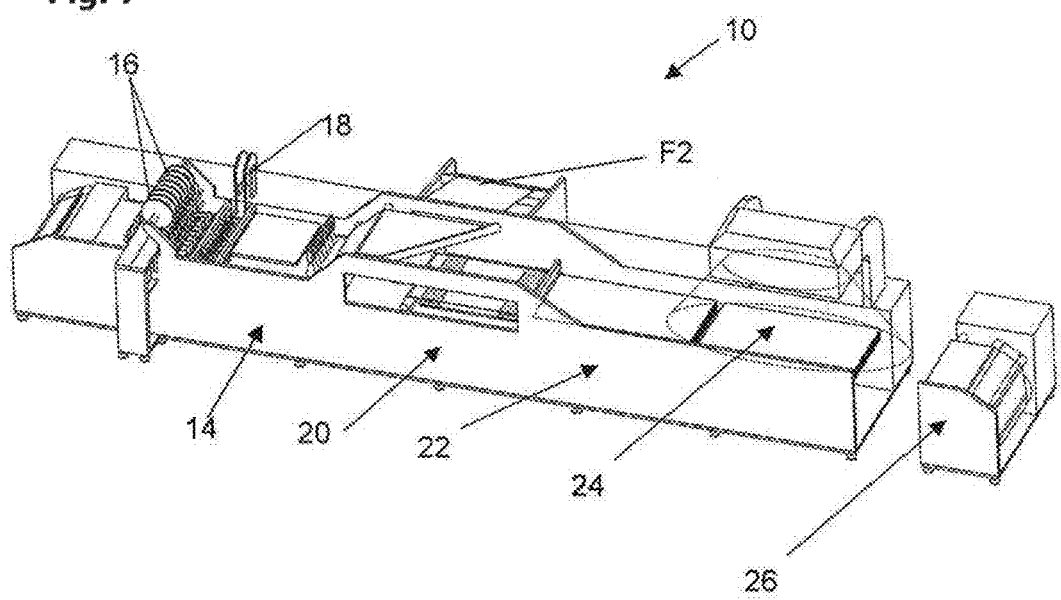
FIG. 7 illustrates schematically a station for winding the solar-module strand formed from flexible thin-film solar cells onto a second roll.

In a contacting station 22 the positive and negative terminals PM of the interconnected solar cells can be contacted from the side remote from the side to be irradiated (through an opening in the rear film)—see FIG. 6—and in a following test station 24 a first functional test of the arrangement completed so far, the prelaminate, can be executed with a sunlight-like illumination.

Figure 8:
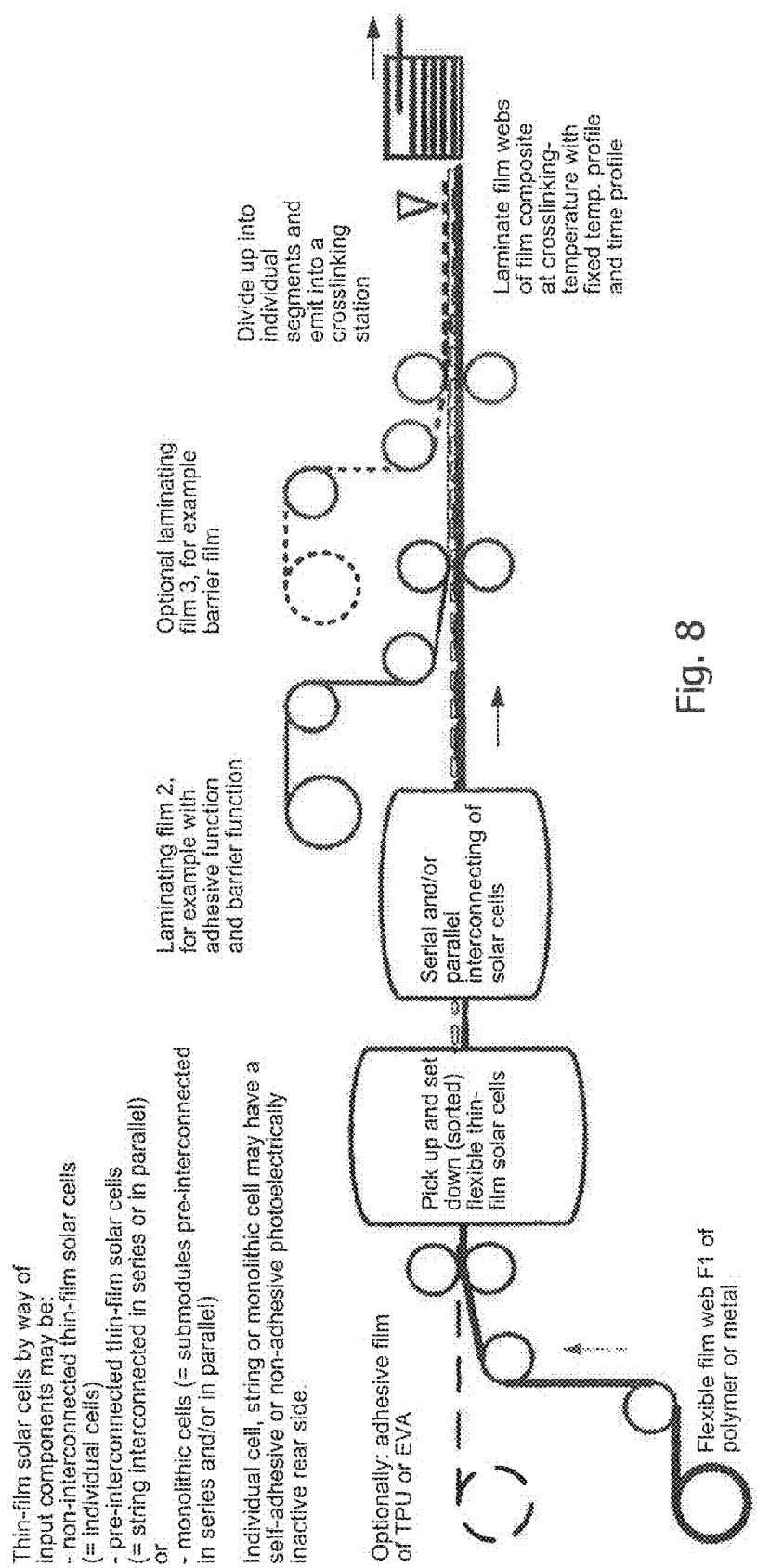
FIG. 8 illustrates schematically a variant wherein solar modules are formed from a multi-layer, for example four-layer, film-web structure with flexible thin-film solar cells.

In FIG. 8 a further variant of the method and of the corresponding apparatus and also of the solar-module arrangement resulting accordingly are illustrated. Provided the flexible thin-film solar cells SZ have not been configured to be self-adhesive, that is to say, they bear no adhesive layer on their photoelectrically inactive (under)side, according to this variant in FIG. 8 an adhesive film of TPU (TPU=thermoplastic elastomers based on urethane) or EVA can be applied onto the first film web FI (substrate film) by means of roll lamination. Subsequently the flexible thin-film solar cells are applied and interconnected (in series and/or in parallel). A laminating film 2 subsequently applied by means of roll lamination may be a barrier film with adhesive layer or a pure adhesive film like the laminating film 1. In this case, however, additionally a barrier film is also applied by means of roll lamination (=laminating film 3). The remaining steps (testing, setting down the finished solar modules, etc.) do not differ from the variants described above. In the case of the variant shown in FIG. 8, solar-module composites that have not yet been crosslinked are set down into an entry region of a crosslinking station operating in stepwise manner and are introduced into the crosslinking station. This crosslinking station shown here operates in stepwise manner and is adjusted by a process-control device, which is not shown in any detail, to expose solar-module composites supplied to it in each instance to a defined temperature profile wherein the film webs are brought for the first time for the required period into the region of the crosslinking-temperature. Further details are elucidated further below in connection with FIG. 11.

Figure 9:
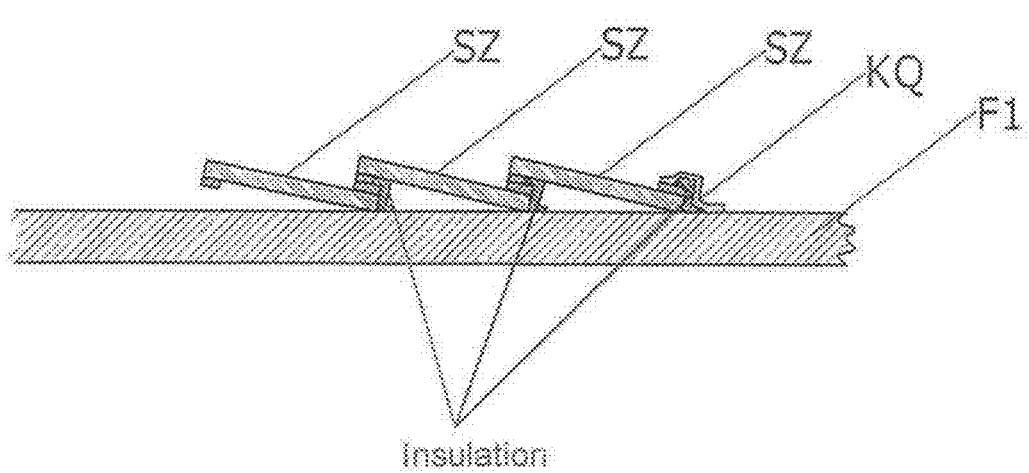
FIG. 9 illustrates schematically a variant wherein insulating material insulates the edge regions of the solar cells relative to the contact strips.

In order to avoid an electrical short circuit of the interconnected solar cells, in some variants of the method/apparatus the edge regions of the solar cells are insulated relative to the contact strips. One or more additional insulating-material dispensers, which may have been integrated into the overall arrangement in modular manner, serve for this purpose, in order to bring insulating material in the form of tape material or paste material or in the form of liquid adhesive to the respective places in the solar cells. This is illustrated in FIG. 9 for a variant for arranging and interconnecting the solar cells SZ, but it may also be used in modifications thereof in order to avoid short circuits of the interconnected solar cells, by their edge regions being insulated in relation to the contact strips.

Figure 10:
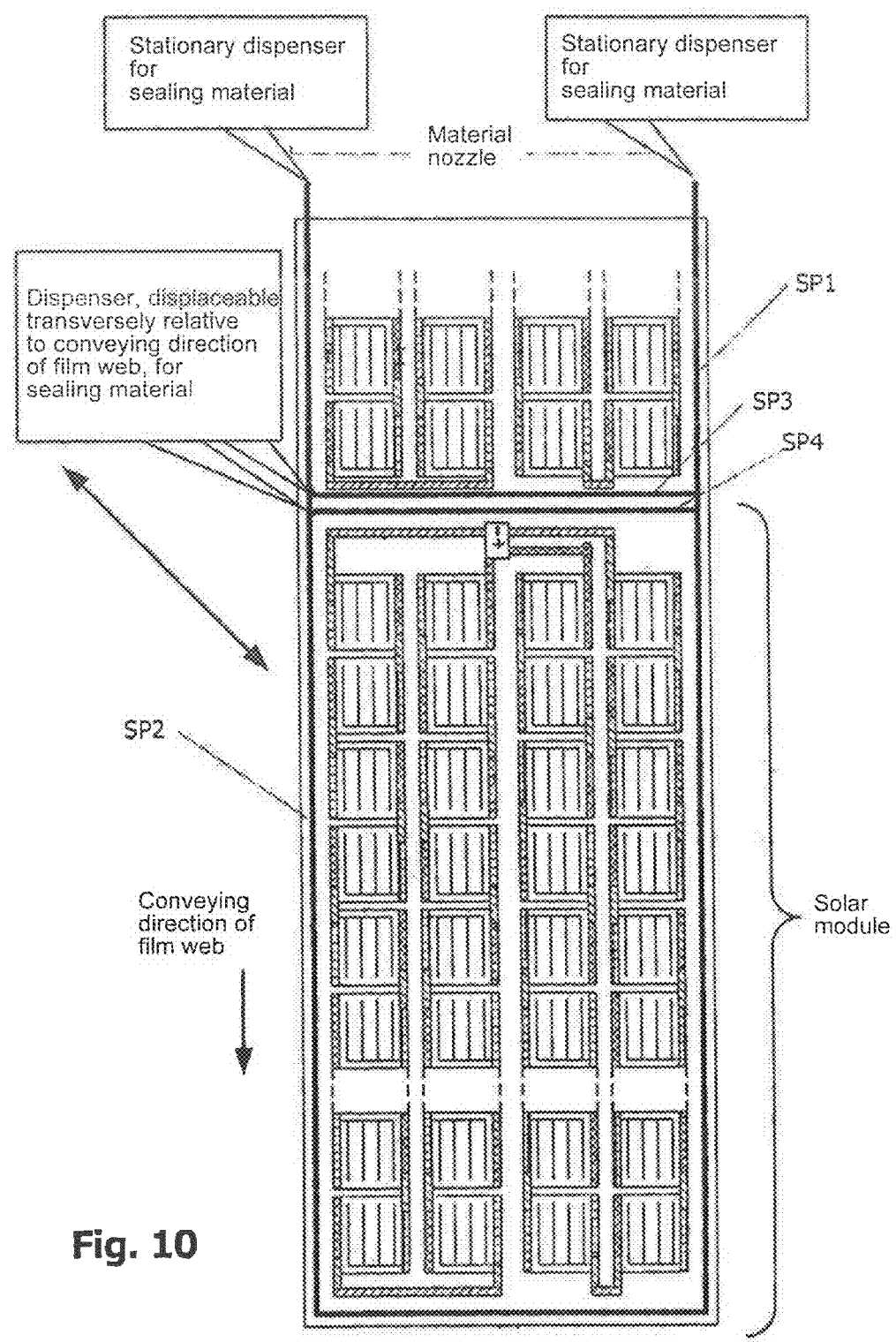
FIG. 10 illustrates how in each instance a dispenser of the dispenser arrangement in the region of a longitudinal edge of the first film web applies sealing material onto the first film web.

From a further dispenser arrangement (see FIG. 10) with at least one or with several dispensers capable of being positioned or displaced longitudinally or transversely relative to the conveying direction of the film webs, sealing material is applied onto the first film web before the second film web is applied onto the flexible thin-film solar cells and onto the first film web, for example by means of roll lamination. The dispenser arrangement applies the sealing material, in the form of one or more strands or strips SP1, SP2, marginally relative to the individual solar modules to be formed, onto the first film web, enclosing the flexible thin-film solar cells of a solar module. Suitable by way of material for the edge seal are butyl rubber or similarly water-tight and vapour-tight plastic materials. In FIG. 10 it can be seen that in each instance a dispenser of the dispenser arrangement in the region of a longitudinal edge of the first film web applies sealing material onto the first film web. A further dispenser of the dispenser arrangement is displaceable transversely relative to the longitudinal edge of the first film web. In this regard this dispenser for sealing material may be displaceable at an acute angle relative to the conveying direction of the first film web and, in the course of moving, applies sealing material, in the form of two strands SP3, SP4 spaced from one another which connect the two marginal strands SP1 and SP2, onto the first film web. Consequently the dispenser arrangement applies the sealing material, in the form of one or more strands or strips, onto the first film web marginally relative to the individual solar modules to be formed. Subsequently the sealing material is attached to the film web or to one of the film webs by means of a roll laminator, preferentially with influence of temperature below the crosslinking-temperature of the film web or of one of the film webs or of the sealing material.

The flexible thin-film solar cells may also be so-called tandem solar cells or triple solar cells. These are multi-spectral solar cells, wherein two layers of solar-receptive materials are superimposed which absorb different regions of the light spectrum and hence achieve high efficiencies. In this regard the partly transparent solar cell situated on top transmits light of certain wavelengths almost unhindered, so that this light can be picked up by the lower solar cell(s). Tandem solar cells are produced using thin-film technology in monolithic blocks which, for example, can be combined with Fresnel lenses. In order to capture the photons of various wavelengths in the individual layers optimally, these layers are generally produced from differing semiconductor materials. In a tandem solar cell the upper layer may be gallium arsenide and the lower layer may be germanium. The gallium arsenide absorbs higher-energy radiation but is transmitting in respect of substantial portions of lower-energy radiation which the germanium layer absorbs. But a combination of different grades of silicon is also possible, for example upper layer consisting of amorphous silicon and the lower layer consisting of microcrystalline silicon. In a triple solar cell the upper layer may be gallium, the middle layer may be indium arsenide, and the lower layer may be gallium indium phosphide. Incidentally, the method and its variants and the apparatus and its variants do not differ from the methods/apparatuses with single-layer solar cells that were described above.

In an apparatus described above with its different variants and with the method described above and its different variants a solar module having the following features is to be produced. A first film web, serving as substrate, bears a plurality of flexible thin-film solar cells arranged on the first film web, which with a first side lie on the first film web. Each of the flexible thin-film solar cells has an electrical first pole and an electrical second pole. A first flexible thin-film solar cell is arranged with at least its first pole in the vicinity of a second pole of a second flexible thin-film solar cell. Electrically conducting contact strips connect the first and the second poles of the flexible thin-film solar cells to one another electrically in series and/or in parallel in the longitudinal and/or transverse directions relative to an edge of the first film web. A transparent, flexible second thermoplastic film web has been laminated onto the first film web and onto the flexible thin-film solar cells. Accordingly, a solar module is formed from the first and the second film webs and from the flexible thin-film solar cells located in between. The second film web is a thermoplastic film web. The flexible thin-film solar cells may have no adhesive layer on their photoelectrically inactive (under)side, and preferentially an adhesive film may have been arranged between the first film web and the flexible thin-film solar cells, and a barrier film with adhesive layer may have been applied by way of the second film web. Insulating material may have been arranged between edge regions of the flexible thin-film solar cells and the electrically conducting contact strips, and sealing material in the form of one or more strands or strips may have been arranged between the first film web and the second film web, marginally relative to the individual solar panels to be formed, surrounding the flexible thin-film solar cells.

Figure 11:
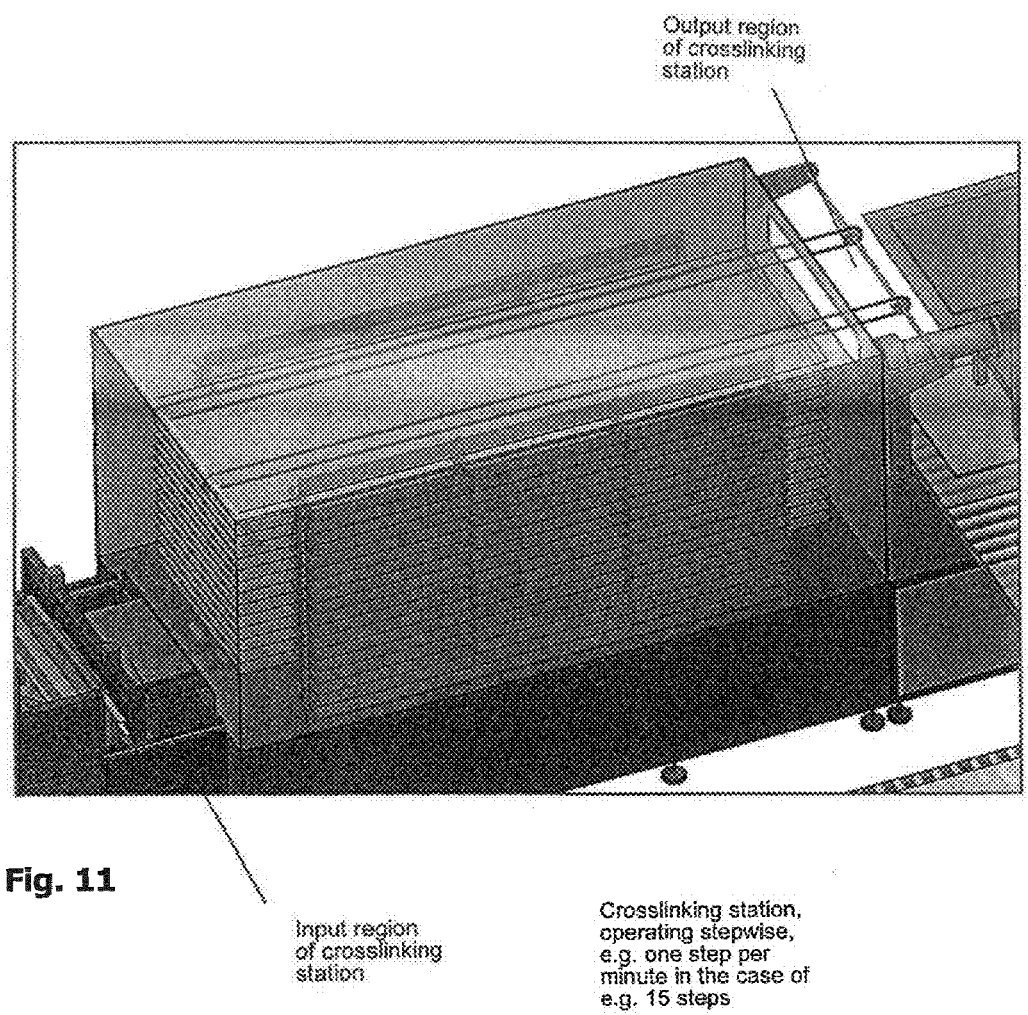
FIG. 11 illustrates a perspective schematic structure of a crosslinking station.

The perspective structure of the crosslinking station illustrated in FIG. 11 shows an entry region and an output region for the flexible thin-film solar modules. In the variant illustrated here it is a question of a crosslinking station operating in stepwise manner, which is to be adjusted by a suitable process-control device to expose solar-module composites that have not yet been crosslinked in each instance to a defined temperature profile wherein the film webs are brought for the first time for the required period into the region of the crosslinking-temperature. For this purpose the solar-module composites (prelaminates) conveyed up to here are brought on a tray into the crosslinking station and are transported upwards there in stepwise manner. In the crosslinking station a stack of trays is located which, when they have reached the topmost position in the stack of the crosslinking station, are ejected via the output region of the crosslinking station for the ready-crosslinked solar modules. Outside the crosslinking station these trays are relocated back to the lowest level of the stack and the solar module is taken out. Hence the crosslinking station operates in the manner of a paternoster and conveys a solar module—for example, one step per minute in the case of, for example, 15 steps—through the crosslinking procedure.

Figure 12:
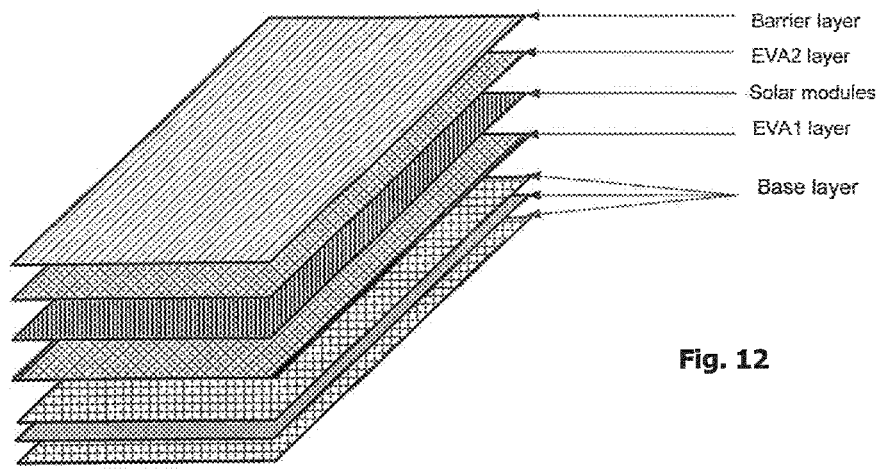
FIG. 12 illustrates a perspective schematic structure of a solar panel.

FIG. 12 illustrates a perspective schematic structure of a solar module with its different layers.

Figure 13:
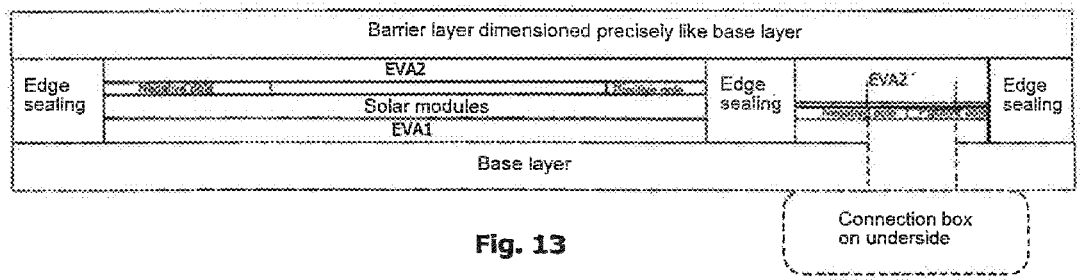
FIG. 13 illustrates a schematic cross section through a solar panel with a connection box mounted from the base layer.
Figure 14:
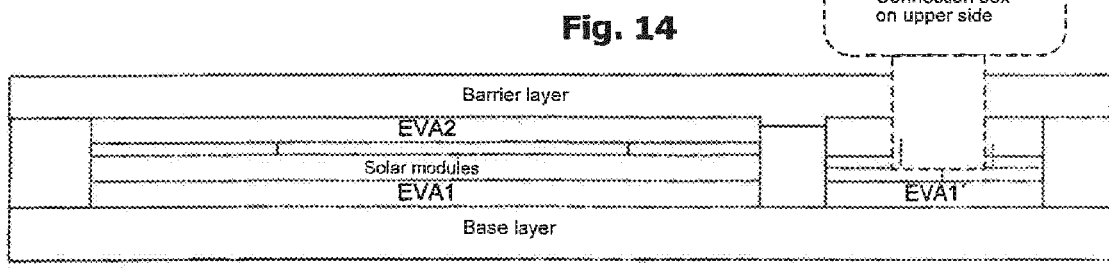
FIG. 14 illustrates a schematic cross section through a solar panel with a connection box mounted from the barrier layer.

In FIG. 13 a schematic cross section through a solar module with a connection box mounted from the base layer is illustrated. FIG. 14 shows a schematic cross section through a solar module, which otherwise corresponds to FIG. 13, with a connection box mounted from the barrier layer.

The apparatus details and method details elucidated above and their variants have been presented in context. Let it be pointed out, however, that these details and individual features are also independent of one another and can also be freely combined with one another. The ratios, shown in the Figures, of the individual parts and segments thereof with respect to one another and their dimensions and proportions are not to be understood as being limiting. Rather, individual dimensions and proportions may also differ from those shown.

The invention claimed is:

1. A method for producing thin-film solar modules, comprising the steps:

making available flexible thin-film solar cells in the form of separate segments in a container or on a web which has been wound up into a roll, the flexible thin-film solar cells resting on the web with a first side, each of the flexible thin-film solar cells being configured with a first electrical pole and a second electrical pole, relocating the flexible thin-film solar cells from the web onto a first film web in such a way that a first flexible thin-film solar cell is positioned with its first pole close to the second pole of a second flexible thin-film solar cell, and applying electrically conducting contact strips onto the first and second poles of the flexible thin-film solar cells in longitudinal and/or transverse directions relative to a conveying direction of the first film web, in order to interconnect the flexible thin-film solar cells electrically in series and/or in parallel, laminating a transparent, flexible, second thermoplastic film web onto the first film web and onto the flexible thin-film solar cells, in order to form a solar-module strand formed from the first and the second film webs and from the flexible thin-film solar cells located in between, isolating the plurality of thin-film solar modules from the solar-module strand, and introducing the isolated thin-film solar modules into a crosslinking station, in order to expose the thin-film solar modules to a defined temperature profile in which the film webs are brought into the range of the crosslinking-temperature for the first time for the requisite period.

2. The method for producing thin-film solar modules, according to claim 1, wherein by way of thin-film solar cells the following are made available:

non-interconnected thin-film solar cells in the form of individual cells, or pre-interconnected thin-film solar cells in the form of a series-interconnected arrangement (serial string), or pre-interconnected thin-film solar cells in the form of a parallel-interconnected arrangement (parallel string), or submodules in the form of monolithic cells interconnected in series and/or in parallel, wherein the individual cells, the serial or the parallel arrangements or the monolithic cells have each been provided with a self-adhesive rear side or with a non-adhesive, photoelectrically inactive rear side.

3. The method according to claim 1, wherein the second film web is attached onto the first film web and onto the solar-module strand formed from the flexible thin-film solar cells located in between with a heat treatment within a temperature range preferentially below the crosslinking-temperature of the second film web.

4. The method according to claim 1, wherein the second film web is laminated onto the first film web and onto the flexible thin-film solar cells with a roll laminator which exhibits at least two counter-rotating rollers which rotate at a defined speed and press together with a defined pressure a composite consisting of the second film web, the first film web and the flexible thin-film solar cells at a defined temperature preferentially below the crosslinking-temperature of the film web or of one of the film webs.

5. The method according to claim 1, wherein prior to the roll lamination a preheating of the composite consisting of the second film web, the first film web and the flexible thin-film solar cells to a defined temperature is effected.

6. The method according to claim 1, wherein the flexible thin-film solar cells introduced into the crosslinking station are exposed in the crosslinking station for a predetermined period to a temperature within a range in which the film webs fuse, become transparent and crosslink.

7. The method according to claim 1, wherein the electrically conducting contact strips are applied onto the flexible thin-film solar cells in the longitudinal direction relative to the conveying direction of the first film web from one or more mutually adjacent dispensers with rolls of conducting contact strips, arranged substantially in the longitudinal direction relative to the conveying direction of the first film web, or dispensers with electrically conducting paste, and/or wherein the electrically conducting contact strips are applied from at least one dispenser arranged substantially in the transverse direction relative to the conveying direction of the first film web, with a roll of conducting contact strips, or from a dispenser with electrically conducting paste onto the flexible thin-film solar cells in the transverse direction relative to the conveying direction of the first film web, in order to interconnect the flexible thin-film solar cells electrically in series and/or in parallel.

8. The method according to claim 1, wherein the flexible thin-film solar cells have no adhesive layer on their photoelectrically inactive (under)side and an adhesive film is applied onto the first film web before the flexible thin-film solar cells are applied onto the first film web.

9. The method according to claim 1, wherein by way of the second film web a barrier film is applied, preferentially by roll lamination, with influence of temperature below the crosslinking-temperature of the film web or of one of the film webs.

10. The method according to claim 1, wherein by way of flexible thin-film solar cells use is made of tandem cells or triple solar cells.

11. The method according to claim 1, wherein insulating material is applied from a dispenser arrangement between edge regions of the flexible thin-film solar cells and the electrically conducting contact strips.

12. The method according to claim 1, wherein sealing material is applied from at least one dispenser arrangement onto the first film web before the second film web is applied onto the flexible thin-film solar cells and onto the first film web.

13. The method according to claim 12, wherein the dispenser arrangement applies the sealing material in the form of one or more strands or strips, marginally relative to the individual solar modules to be formed, onto the first film web, surrounding the flexible thin-film solar cells.

14. An apparatus for producing a solar-module strand comprising:
a pick-up-and-set-down unit for relocating flexible thin-film solar cells onto a first film web coming from a first roll, in order to interconnect these flexible thin-film solar cells electrically,
a contacting region for applying electrically conducting contact strips from several mutually adjacent dispensers arranged substantially in a longitudinal direction relative to a conveying direction of the first film web onto the flexible thin-film solar cells and onto the first film web and/or for applying electrically conducting contact strips from a dispenser arranged substantially in a transverse direction relative to the conveying direction of the first film web onto the flexible thin-film solar cells and onto the first film web in the transverse direction relative to the conveying direction of the first film web,
a laminating station for laminating a transparent, flexible, thermoplastic second film web onto the first film web and onto the flexible thin-film solar cells, in order to obtain a solar-module strand formed from the first and the second film webs and from the flexible thin-film solar cells located in between,
a contacting station for releasing, in each case, a positive and negative terminal, embedded in the second film web, of the interconnected solar cells from the second film web,
a test station with a sunlight-like illumination for executing a function test of the solar module completed so far, and
a crosslinking station for laminating individual solar modules from the solar-module strand in a set-down region after a division of the solar-module strand into individual segments, whereby the individual thin-film solar modules are exposed in the crosslinking station to a defined temperature profile in which the film webs are brought into the range of their crosslinking-temperature for the first time for the requisite period.

15. The apparatus for producing a solar-module strand according to claim 14, wherein the pick-up-and-set-down unit has been set up to make available, by way of thin-film solar cells,
non-interconnected thin-film solar cells in the form of individual cells, or
pre-interconnected thin-film solar cells in the form of a series-interconnected arrangement (serial string), or
pre-interconnected thin-film solar cells in the form of a parallel-interconnected arrangement (parallel string), or
submodules in the form of monolithic cells pre-interconnected in series and/or in parallel, whereby
the individual cells, the serial or parallel arrangements or the monolithic cells have each been provided with a self-adhesive rear side or with a non-adhesive, photoelectrically inactive rear side.

16. The apparatus for producing a solar-module strand according to claim 14, wherein the pick-up-and-set-down unit has a roll-off pick-up-and-set-down head that is capable of being displaced and/or rotated in the X-, Y-, and Z-directions, which picks up individual flexible thin-film solar cells with reduced pressure on a surface of the head and retains them during the relocating and wherein the pick-up-and-set-down unit arranges a plurality of flexible thin-film solar cells onto the first film web in the longitudinal and/or transverse directions relative to the conveying direction of the first film web.

17. The apparatus for producing a solar-module strand according to claim 14, wherein the laminating station exhibits a first roll laminator which exhibits at least one roll pair consisting of counter-rotating rollers, which conveys the stack consisting of first film web with the flexible thin-film solar cells and the second film web through between themselves, whereby the counter-rotating rollers rotate at a defined speed and press together a composite consisting of the second film web, the first film web and the flexible thin-film solar cells at a defined temperature below the crosslinking-temperature of the film web or of one of the film webs, with a defined pressure.

18. The apparatus for producing a solar-module strand according to claim 14, wherein there is assigned to the/each roll laminator on the upstream side a preheating zone with which the film webs to be laminated are brought to a desired temperature level.

19. The apparatus for producing a solar-module strand according to claim 15, wherein the laminating station exhibits a second roll laminator, in order for flexible thin-film solar cells that bear no adhesive layer on their photoelectrically inactive side an adhesive film is applied onto the first film web before the flexible thin-film solar cells are applied onto the first film web, preferentially by roll lamination with influence of temperature below the crosslinking-temperature of one of the film webs.

20. The apparatus for producing a solar-module strand according to claim 15, wherein a third roll laminator has been provided, in order to apply by way of second film web a barrier film with adhesive layer, preferentially with influence of temperature below the crosslinking-temperature of the film web or of one of the film webs.

21. The apparatus for producing a solar-module strand according to claim 15, wherein a dispensing arrangement for strips or tapes of insulating material has been provided which insulates edge regions of the flexible thin-film solar cells in relation to the electrically conducting contact strips.

22. The apparatus for producing a solar-module strand according to claim 15, wherein the flexible thin-film solar cells are tandem solar cells or triple solar cells.

23. The apparatus for producing a solar-module strand according to claim 15, wherein a dispenser arrangement for sealing material has been provided, said dispenser arrangement applying the sealing material onto the first film web before the second film web is applied onto the flexible thin-film solar cells and onto the first film web.

24. The apparatus for producing a solar-module strand according to claim 23, wherein the dispenser arrangement applies the sealing material, in the form of one or more strands or strips, onto the first film web marginally relative to the individual solar modules to be formed and subsequently a roll laminator, preferentially with influence of temperature below the crosslinking-temperature of the film web or of one of the film webs or of the sealing material, attaches the sealing material to the film web or to one of the film webs.

25. The apparatus for producing a solar-module strand according to claim 14, wherein the crosslinking station has been set up by a process-control unit to expose the flexible thin-film solar cells introduced into it for a predetermined period to a temperature within a range in which the film webs fuse, become transparent and crosslink.

* * * * *